United States Patent [19]

Umbaugh

[11] 3,777,365

[45] Dec. 11, 1973

[54] CIRCUIT CHIPS HAVING BEAM LEADS ATTACHED BY FILM STRIP PROCESS

[75] Inventor: Charles Wayne Umbaugh, Phoenix, Ariz.

[73] Assignee: Honeywell Information Systems, Inc., Waltham, Mass.

[22] Filed: Mar. 6, 1972

[21] Appl. No.: 232,029

[52] U.S. Cl. .................................................. 29/591
[51] Int. Cl. .............................................. B01j 17/00
[58] Field of Search .................. 29/576 S, 591, 589, 29/580, 583

[56] References Cited

UNITED STATES PATENTS

| | | | |
|---|---|---|---|
| 3,271,625 | 9/1966 | Caracciolo | 29/576 S |
| 3,390,308 | 6/1968 | Marley | 29/576 S |
| 3,673,016 | 6/1972 | Gerstner | 29/583 |
| 3,689,991 | 9/1972 | Aird | 29/589 |

*Primary Examiner*—Charles W. Lanham
*Assistant Examiner*—W. C. Tupman
*Attorney*—Edward W. Hughes et al.

[57] ABSTRACT

Circuit chip devices having beam leads are manufactured by first attaching leads formed on a film strip carrier to the chip, and then severing the lead ends to free the beam leaded chip from the carrier.

3 Claims, 8 Drawing Figures

CIRCUIT CHIPS HAVING BEAM LEADS ATTACHED BY FILM STRIP PROCESS

BACKGROUND OF THE INVENTION

This invention relates to improvements in circuit chip devices. More particularly, the invention relates to microminiature electronic devices having beam leads for connecting the devices to external circuit elements, and a method for attaching the beam leads to the devices.

One of the most common elements used for manufacturing modern electronic systems is the hybrid interconnect circuit (HIC). The HIC is generally a microminiature package structure comprised of interconnecting conductors and passive components formed on a substrate such as alumina, and active components such as semiconductor integrated circuits joined to the conductors. The term passive component includes not only components formed by deposition on the substrate, but monolithic and discrete devices as well. The latter named devices may be joined to the substrate conductors.

One prior art method of chip joining first bonds the back side of the chips or dice to the substrate and then makes the necessary chip to conductor connections by flying-wire bonds. The technique of thermocompression or ultrasonic bonding of individual wires has been successful in achieving a reduction in size and weight of package structures, but with attendant problems and disadvantages. Each wire must be aligned before the bond is made. After bonding, wire sag may cause shorting of wires to each other or to other components of the structure. Because of the complexity of the individual, cumulative tasks and the complexity of the production equipment used to perform the tasks, the skill level of the assemblers must be high. Furthermore, the cumulative step technique offers no ability to functionally test the assembly until essentially all of the connections are made.

An alternate prior art method of chip joining is the well known flip-chip technique. The technique involves the formation of pillars or bumps on the IC chip and/or the interconnecting conductors, and the subsequent face-down joining of the chip to the conductors. Face-down bonding must be accomplished with the bonding areas hidden from view, consequently, registration or alignment problems may occur. Moreover, the only path offered for thermal conduction is through the bonded interconnections.

Still another prior art method of chip joining utilizes purchased beam leaded devices. In recent years, beam lead technology has been the basis of most developmental efforts in the industry. Beam leads are generally defined in the art as metallization projecting from a microminiature device such as a semiconductor integrated circuit and connecting the circuit elements of the device to metallized circuit patterns or other types of substrates by a bonding process. Further, beam leads are generally self-supporting projections built up on the active face of the device by an electroforming process. The beam-leaded chips are joined to the substrate with their active face down.

A major consideration with beam leads is the relatively high cost per device due to the additional process steps. Prior art beam leads can be formed only by the vendor during the wafer manufacturing process. Furthermore, each chip type may have but one lead geometry. Availability is thus limited in both volume and variety.

Heat dissipation from a rigidly mounted beam-lead chip is similar to that of the flip-chip device. Both are junction-isolated devices.

SUMMARY OF THE INVENTION

The invention provides an improved microminiature circuit device having beam leads. A preferred embodiment describes a method for transforming any integrated circuit chip having conventional contact pad geometry and metallurgy, as those intended for flying-wire or flip-chip interconnection, into a beam-leaded chip. Variable lead geometries may be affixed if desired. The leads may be rigid or flexible to permit standard beam-lead device attachment or die bonding to a substrate. The process utilizes an indexed flexible film-strip carrier having metal film laminated thereto. Elongated beam leads are etched from the metal film and subsequently joined to chips aligned beneath the lead ends. The leads are then severed from the strip carrier either prior to or during attachment of the beam-leaded device to an external circuit.

BRIEF DESCRIPTION OF THE DRAWING

The invention is pointed out with particularity in the appended claims, however, other features of the invention will become more apparent and the invention will be best understood by referring to the following detailed description in conjunction with the accompanying drawings in which:

DETAILED DESCRIPTION OF THE INVENTION

Figure 1:
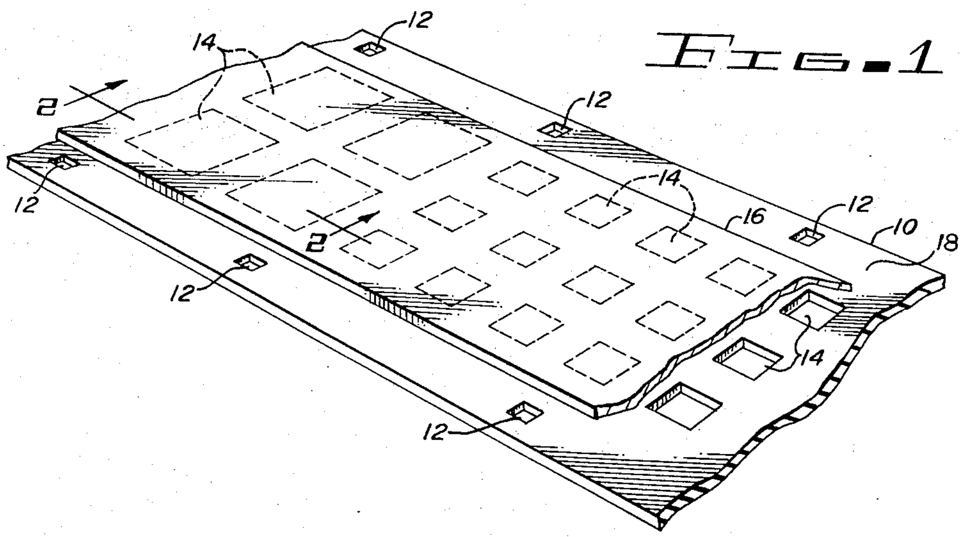
FIG. 1 is a cutaway perspective view of the carrier.
Figure 2:
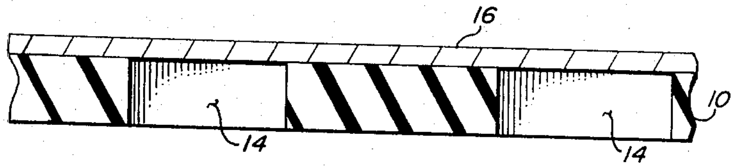
FIG. 2 is a section of FIG. 1 taken along lines 2—2.

FIGS. 1 and 2 show a carrier or substrate 10 of flexible organic film having indexing apertures 12 and circuit apertures 14 formed therein. A thin strip of metallic foil 16 is laminated to a surface 18 of the film substrate 10. The metallic foil 16 may be any material suitable for the formation by etching of interconnecting leads, as for example, copper, nickel or gold. The metallic foil 16 may typically be one-half ounce per square foot electroformed copper having a thickness of approximately 18 microns. The substrate 10 may be a flexible organic film material such as Kapton having a thickness from one-half to 3 mils or greater. The metallic foil 16 may be laminated to the film of the substrate 10 with or without an adhesive. One such flexible laminate material, called MICRO-CLAD, is manufactured and sold by the Fortin Laminating Corp., San Fernando, Calif. The apertures 12 and 14 in the substrate 10 may be formed by punching prior to laminating the foil, or by photochemical etching after the foil 16 is laminated to the film 10.

Figure 3:
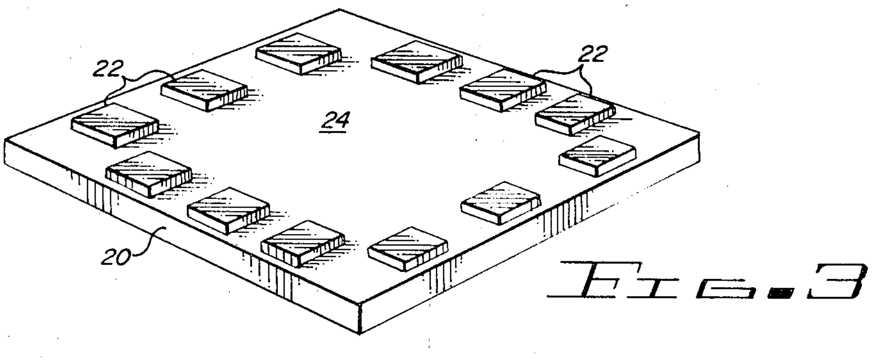
FIGS. 3 and 8 are perspective views of an integrated circuit chip, respectively, before and after attachment of the beam leads.

FIG. 3 illustrates an integrated circuit chip 20 having a plurality of contact pads 22 around the periphery of the chip. The contact pads 22 provide terminal means for connecting the electronic circuit elements or devices (not shown) formed in the active region 24 of the chip 20 to external circuits. The integrated circuit chip 20 of FIG. 3 is intended to illustrate only one of a wide variety of electronic circuit devices to which leads may be attached. Other devices, both active and passive, such as resistors, capacitors, diodes, transistors, and complex integrated circuits may be beam leaded in accordance with my invention.

Circuit devices are commonly available in the form of a wafer comprising a plurality of individual devices of like kind. Most commonly available IC chips have aluminum pad metallization. The chips may be obtained either as individual chips or in wafer form. The wafers are coated with a thin (about 1 micron thick) insulating layer such as glass, quartz or silicon dioxide. The insulating layer is etched to expose the underlying metal at the contact pad 22 locations. One or more thin layers of metal may be added to yield the raised contact pads 22, however, it is understood that raised pads are not required. The last metal added to the contact pad locations is one with which the metal or metal system of the leads to be attached to the contact pads 22 must be metallurgically compatible. Wafer manufacturers employ various processes to form the contact pads 22 on the individual devices 20. These processes form no part of my invention. Indeed, flexibility of the design of a system packaging structure is enhanced by my invention because the constraints of chip configurations imposed by special processing of the wafer by the manufacturer such as the addition thereto of beam leads, bumps, etc., do not limit the system designer's choice of device suppliers. Additionally, there is an attendant lower device cost.

Figure 5:
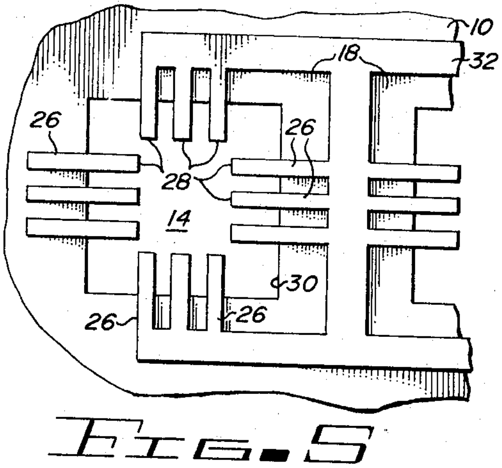
FIGS. 5–7 illustrate various successive steps of the process of my invention.
Figure 4:
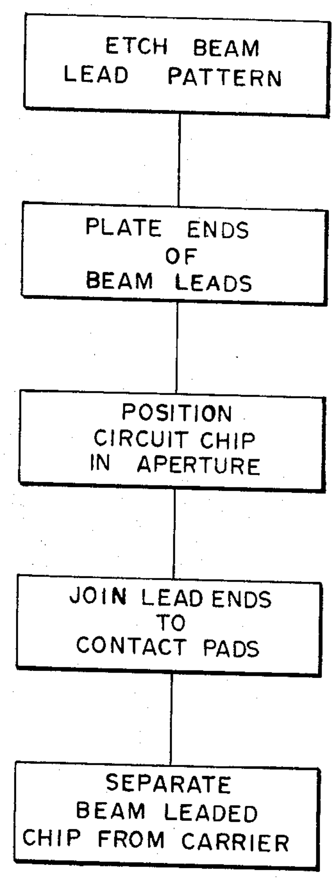
FIG. 4 is a flow diagram of the process.

Referring now to FIG. 4 in conjunction with FIGS. 5–7, the method for attaching a beam lead to an integrated circuit chip will now be described.

The term "beam lead" is defined herein as a metallized lead structure having a lateral cross section generally rectangular in shape, the lateral cross sectional dimensions and area being substantially consistent the length of the lead. The longitudinal shape of the beam lead may be rectangular (as in FIG. 8) or may include a lateral jog in order to achieve variable lead geometries. The term "beam lead" is not intended to include fan-out structures, either supported or unsupported, i.e., a lead having cross sectional dimensions and/or area which increase as the distance from the chip end of the lead increases. As shown in FIG. 5, the metal foil 16 (FIG. 1) is photoetched using techniques well known in the art to form elongated leads or fingers 26. Each of the elongated leads 26 is supported by the carrier or substrate 10. An end 28 of each of the elongated leads 26 extends outwardly from the surface 18 of the substrate 10 beyond an edge 30 of and over one of the circuit apertures 14. The elongated leads 26 may be formed individually as shown in the left portion of FIG. 5. The individual leads may be tinned or otherwise coated by electroless plating with a metal or alloy metallurgically compatible with the metal of the pads 22 (FIG. 3). Alternatively, the leads 26 may be interconnected by a grid 32, formed during the etching step of a portion of the metal foil 16, in order to provide a common conductive path for electroplating the leads.

Figure 6:
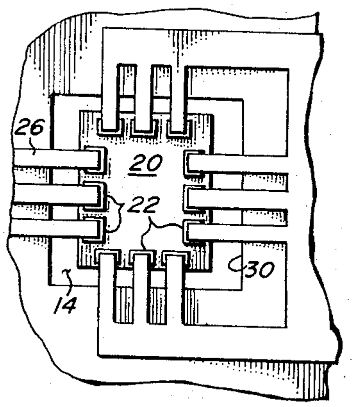

FIG. 6 illustrates the step of positioning of the chip 20 within the periphery 30 of the circuit aperture 14. The contact pads 22 are aligned beneath the lead ends 28. The alignment may be accomplished by any of the well known means available in the industry such as a micropositionable X-Y support table. Registration of the lead ends 28 is maintained by the indexing apertures 12 of the carrier strip 10 (FIG. 1).

Figure 7:
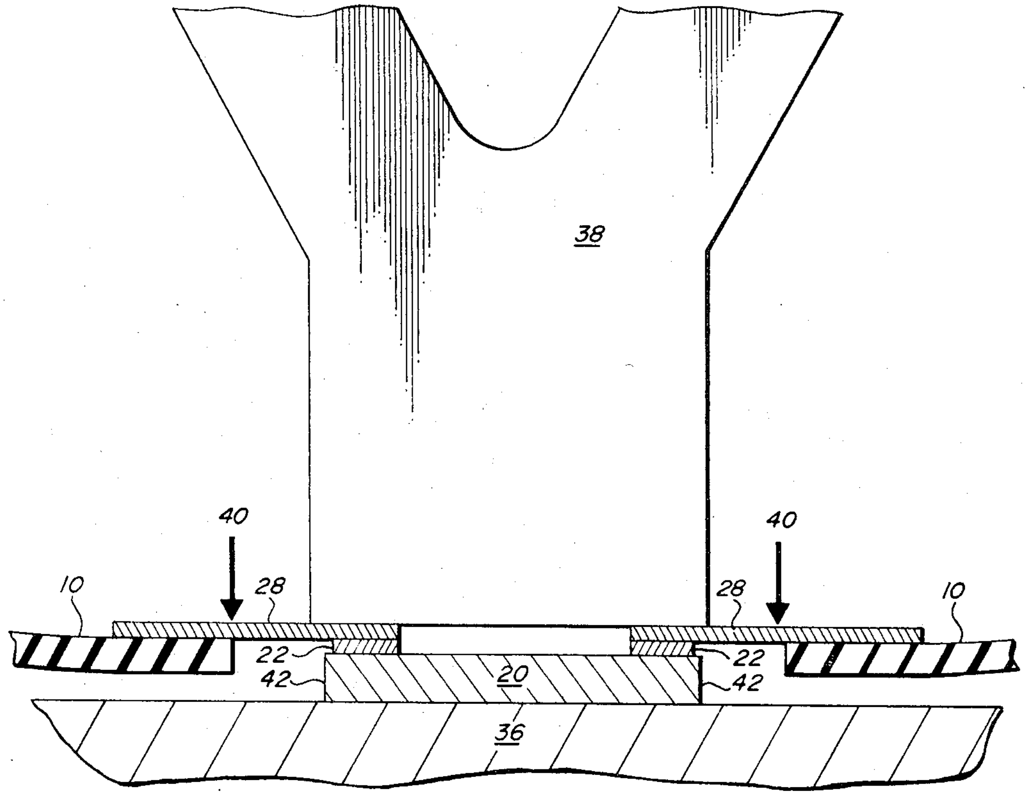

FIG. 7 illustrates a representative chip to beam lead joining operation, performed after the alignment operation of FIG. 6. The chip 20 may be held in place on a support plate 36 by any suitable means such as meltable wax or a vacuum orifice (not shown) in the plate 36. The plate 36 supports the chip 20, as a bonding tool 38, shown here as a thermocompression bonding tip, supplies the necessary force and/or heat parameters simultaneously to all the bonding sites to effect the joining of the lead ends 28 to the contact pads 22 of the chip. It is understood that other joining techniques such as ultrasonic bonding, laser welding, or solder reflow may be employed.

Figure 8:
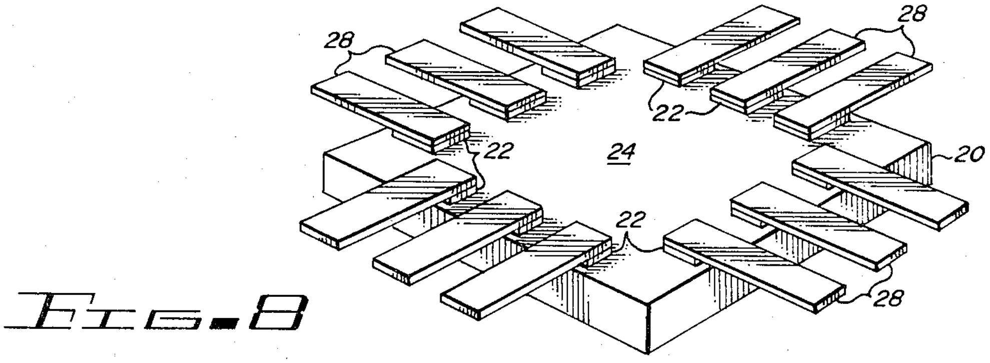

Subsequent to the bonding operation, the lead ends 28 are severed, as for example, by cutting, at a point indicated in FIG. 7 by the arrows 40. The point of separation 40 is preferably a distance of 125 microns or more from the edge 42 of the chip 20, in order to provide sufficient lead structure for connecting the integrated circuit chip to a circuit assembly. Severing the lead ends 28 frees the circuit device and the leads attached thereto from the carrier 10 to form a beam leaded circuit device as illustrated in FIG. 8. The beam leads formed in the manner described are typically 100 microns wide on 200 micron centers, and 14 microns thick. The beam-lead lengths may range from 125 microns to 900 microns or more, depending on the type of external connection technique. The self-supporting, shorter length leads are utilized for the face-down configuration; the longer length for the die-bond-to-substrate technique. Depending upon the device to which the beam leads are attached in accordance with my invention, the beam lead widths may range from 50 microns on 150 micron centers to 140 microns on 300 micron centers. The thickness of the beam leads may correspondingly vary from 13 to 40 microns.

A representative embodiment illustrative of my invention has been shown and described. Different arrangements incorporating the principles of the invention may be used. For example, the beam leads may be attached at their alternate ends to different chips to form an air-isolated integrated circuit. It is therefore understood that my invention may be practiced otherwise than as specifically described and it is intended by the appended claims to cover all such modifications which fall within the true spirit and scope of the invention.

I claim:

1. In a process utilizing metallic film laminated to a flexible strip carrier for manufacturing integrated circuit assemblies, an improved method for producing a beam-leaded chip from a device having contact pads of conventional geometry and metallurgy, the improvement comprising the steps of:

etching the metal film to yield a predetermined pattern of elongated leads, each of the leads supported by the carrier, ends of the leads extending over an aperture formed in the carrier, each of the extended lead ends having a lateral cross-sectional area substantially consistent the length of the lead end;

positioning a chip within the periphery of the circuit aperture;

joining the ends of the leads to the contact pads of the positioned chip;

severing the joined lead ends at a point at least 125 microns from the edge of the chip, the severed lead ends forming beam leads and removing without additional insulating the beam-leaded chip from the carrier.

2. The method as described in claim 1, wherein the positioning step comprises the steps of:

supporting the circuit chip to make the contact pads substantially coplanar with the lead ends; and aligning the contact pads of the circuit chip with corresponding ends of the elongated leads.

3. The method as described in claim 1 which includes after the etching step, the step of:

plating the ends of the leads with a metal system compatible with the metallurgy of the contact pads.

* * * * *